US010164484B2

(12) United States Patent
Zeine et al.

(10) Patent No.: US 10,164,484 B2
(45) Date of Patent: Dec. 25, 2018

(54) TECHNIQUES FOR LEVERAGING EXISTING COMPONENTS OF A DEVICE FOR WIRELESS POWER TRANSFER FUNCTIONALITY

(71) Applicant: Ossia Inc., Bellevue, WA (US)

(72) Inventors: Hatem Zeine, Bellevue, WA (US); Dale Mayes, Bothell, WA (US)

(73) Assignee: Ossia Inc., Bellevue, WA (US)

( * ) Notice: Subject to any disclaimer, the term of this patent is extended or adjusted under 35 U.S.C. 154(b) by 78 days.

(21) Appl. No.: 15/175,756

(22) Filed: Jun. 7, 2016

(65) Prior Publication Data

US 2016/0359380 A1  Dec. 8, 2016

Related U.S. Application Data

(60) Provisional application No. 62/172,752, filed on Jun. 8, 2015.

(51) Int. Cl.
| | |
|---|---|
| *H02J 50/80* | (2016.01) |
| *H02J 7/02* | (2016.01) |
| *H02J 50/20* | (2016.01) |
| *H02J 50/40* | (2016.01) |
| *G01R 31/3185* | (2006.01) |
| *G01R 31/40* | (2014.01) |

(Continued)

(52) U.S. Cl.
CPC ...... *H02J 50/80* (2016.02); *G01R 31/318566* (2013.01); *G01R 31/40* (2013.01); *H02J 7/0004* (2013.01); *H02J 7/025* (2013.01); *H02J 7/045* (2013.01); *H02J 50/20* (2016.02); *H02J 50/40* (2016.02); *H04L 12/6418* (2013.01); *H04W 4/12* (2013.01); *H04L 12/2818* (2013.01); *H04L 67/12* (2013.01); *H04L 2012/2841* (2013.01); *H04W 8/005* (2013.01); *H04W 52/0212* (2013.01)

(58) Field of Classification Search
CPC .. H02J 50/80; H02J 50/20; H02J 7/025; H02J 7/045
USPC ......................................................... 307/104
See application file for complete search history.

(56) References Cited

U.S. PATENT DOCUMENTS

| | | | |
|---|---|---|---|
| 7,889,777 B2 * | 2/2011 | Ruijter ................. | H04B 1/7156 375/134 |
| 2010/0033021 A1 | 2/2010 | Bennett | |

(Continued)

FOREIGN PATENT DOCUMENTS

| | | |
|---|---|---|
| JP | 2011-193707 A | 9/2011 |
| WO | 2010118075 A2 | 10/2010 |

(Continued)

OTHER PUBLICATIONS

English translation for WO2014106390A1 via https://worldwide.espacenet.com; pp. 1-9.*

(Continued)

*Primary Examiner* — Alfonso Perez Borroto

(57) ABSTRACT

Techniques are described herein for leveraging these existing components of electronic devices with wireless or internet connectivity to reduce cost, size and complexity of electronic devices while enabling wireless power transfer. The techniques described herein can also be utilized to new low cost dual-function devices that utilize one or more of the same components for both wireless connectively and wireless power transfer.

19 Claims, 11 Drawing Sheets

(51) Int. Cl.
    *H04W 4/12*     (2009.01)
    *H02J 7/04*     (2006.01)
    *H04L 12/64*     (2006.01)
    *H02J 7/00*     (2006.01)
    *H04W 52/02*     (2009.01)
    *H04L 12/28*     (2006.01)
    *H04L 29/08*     (2006.01)
    *H04W 8/00*     (2009.01)

(56) References Cited

U.S. PATENT DOCUMENTS

| | | | |
|---|---|---|---|
| 2010/0201202 A1 | 8/2010 | Kirby et al. | |
| 2010/0201533 A1* | 8/2010 | Kirby | H02J 7/025 340/636.1 |
| 2011/0270452 A1 | 11/2011 | Lu et al. | |
| 2012/0206096 A1 | 8/2012 | John | |
| 2013/0154557 A1 | 6/2013 | Lee et al. | |
| 2013/0278209 A1 | 10/2013 | Von Novak, III et al. | |
| 2014/0008992 A1 | 1/2014 | Leabman | |
| 2014/0285145 A1 | 9/2014 | Patro et al. | |
| 2014/0375261 A1 | 12/2014 | Manova-Elssibonye et al. | |
| 2015/0358913 A1* | 12/2015 | Xu | H04W 52/143 455/522 |

FOREIGN PATENT DOCUMENTS

| | | | | |
|---|---|---|---|---|
| WO | WO 2010118075 A2 * | 10/2010 | | H01Q 3/2647 |
| WO | 2014106390 A1 | 7/2014 | | |
| WO | WO 2014106390 A1 * | 7/2014 | | H04W 52/143 |

OTHER PUBLICATIONS

Notification of Transmittal of the International Search Report and the Written Opinion of the International Searching Authority, or the Declaration received in International Application No. PCT/US2016/36411 dated Sep. 2, 2016, 14 pages.

Notification of Transmittal of the International Search Report and the Written Opinion of the International Searching Authority, or the Declaration received in International Application No. PCT/US2016/036493 dated Sep. 13, 2016, 24 pages.

Notification of Transmittal of the International Search Report and the Written Opinion of the International Searching Authority, or the Declaration received in International Application No. PCT/US2016/036404 dated Sep. 15, 2016, 13 pages.

Japanese Patent Application No. 2017-563608, Office Action, 6 pages, dated Sep. 18, 2018.

* cited by examiner

TECHNIQUES FOR LEVERAGING EXISTING COMPONENTS OF A DEVICE FOR WIRELESS POWER TRANSFER FUNCTIONALITY

CROSS-REFERENCE TO RELATED APPLICATIONS

This application claims priority to and benefit from U.S. Provisional Patent Application Ser. No. 62/172,752 titled "SYSTEMS AND METHODS FOR IMPROVED WIRELESS POWER TRANSFERS" filed on Jun. 8, 2015, which is expressly incorporated by reference herein.

TECHNICAL FIELD

The technology described herein relates generally to the field of wireless power transmission and, more specifically, to techniques for leveraging existing components of a device for wireless power transfer functionality.

BACKGROUND

Many electronic devices are powered by batteries. Rechargeable batteries are often used to avoid the cost of replacing conventional dry-cell batteries and to conserve precious resources. However, recharging batteries with conventional rechargeable battery chargers requires access to an alternating current (AC) power outlet, which is sometimes not available or not convenient. It would, therefore, be desirable to derive power for electronics wirelessly.

Accordingly, a need exists for technology that overcomes the problem demonstrated above, as well as one that provides additional benefits. The examples provided herein of some prior or related systems and their associated limitations are intended to be illustrative and not exclusive. Other limitations of existing or prior systems will become apparent to those of skill in the art upon reading the following Detailed Description.

BRIEF DESCRIPTION OF THE DRAWINGS

One or more embodiments of the present invention are illustrated by way of example and not limitation in the figures of the accompanying drawings, in which like references indicate similar elements.

DETAILED DESCRIPTION

Figure 1:
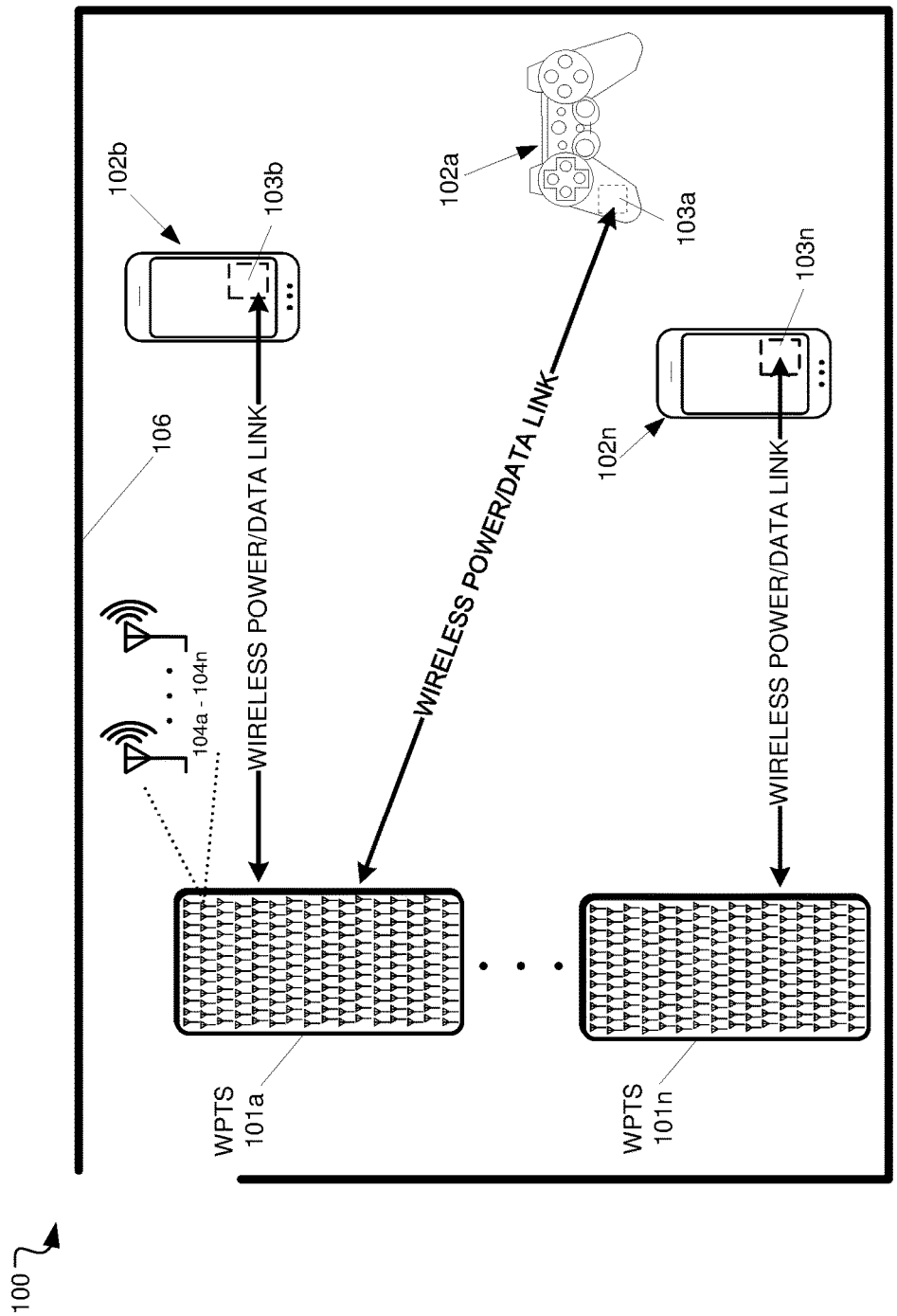
FIG. 1 depicts a block diagram including an example wireless power delivery environment illustrating wireless power delivery from one or more wireless power transmission systems to various wireless devices within the wireless power delivery environment in accordance with some embodiments.

The following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be, but not necessarily are, references to the same embodiment; and, such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but no other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

I. Wireless Power Transmission System Overview/Architecture

FIG. 1 depicts a block diagram including an example wireless power delivery environment 100 illustrating wireless power delivery from one or more wireless power transmission systems (WPTS) 101a-n (also referred to as "wireless power delivery systems", "antenna array systems" and "wireless chargers") to various wireless devices 102a-n within the wireless power delivery environment 100, according to some embodiments. More specifically, FIG. 1 illustrates an example wireless power delivery environment 100 in which wireless power and/or data can be delivered to available wireless devices 102a-102n having one or more wireless power receiver clients 103a-103n (also referred to herein as "clients" and "wireless power receivers"). The wireless power receiver clients are configured to receive and process wireless power from one or more wireless power transmission systems 101a-101n. Components of an example wireless power receiver client 103 are shown and discussed in greater detail with reference to FIG. 4.

As shown in the example of FIG. 1, the wireless devices 102a-102n include mobile phone devices and a wireless game controller. However, the wireless devices 102a-102n can be any device or system that needs power and is capable of receiving wireless power via one or more integrated power receiver clients 103a-103n. As discussed herein, the one or more integrated power receiver clients receive and process power from one or more wireless power transmission systems 101a-101n and provide the power to the wireless devices 102a-102n (or internal batteries of the wireless devices) for operation thereof.

Each wireless power transmission system 101 can include multiple antennas 104a-n, e.g., an antenna array including hundreds or thousands of antennas, which are capable of delivering wireless power to wireless devices 102. In some embodiments, the antennas are adaptively-phased radio frequency (RF) antennas. The wireless power transmission system 101 is capable of determining the appropriate phases with which to deliver a coherent power transmission signal to the power receiver clients 103. The array is configured to emit a signal (e.g., continuous wave or pulsed power transmission signal) from multiple antennas at a specific phase relative to each other. It is appreciated that use of the term "array" does not necessarily limit the antenna array to any specific array structure. That is, the antenna array does not need to be structured in a specific "array" form or geometry.

Furthermore, as used herein he term "array" or "array system" may be used include related and peripheral circuitry for signal generation, reception and transmission, such as radios, digital logic and modems. In some embodiments, the wireless power transmission system 101 can have an embedded Wi-Fi hub for data communications via one or more antennas or transceivers.

The wireless devices 102 can include one or more receive power clients 103. As illustrated in the example of FIG. 1, power delivery antennas 104a-104n are shown. The power delivery antennas 104a are configured to provide delivery of wireless radio frequency power in the wireless power delivery environment. In some embodiments, one or more of the power delivery antennas 104a-104n can alternatively or additionally be configured for data communications in addition to or in lieu of wireless power delivery. The one or more data communication antennas are configured to send data communications to and receive data communications from the power receiver clients 103a-103n and/or the wireless devices 102a-102n. In some embodiments, the data communication antennas can communicate via Bluetooth™, Wi-Fi™, ZigBee™, etc. Other data communication protocols are also possible.

Each power receiver client 103a-103n includes one or more antennas (not shown) for receiving signals from the wireless power transmission systems 101a-101n. Likewise, each wireless power transmission system 101a-101n includes an antenna array having one or more antennas and/or sets of antennas capable of emitting continuous wave or discrete (pulse) signals at specific phases relative to each other. As discussed above, each the wireless power transmission systems 101a-101n is capable of determining the appropriate phases for delivering the coherent signals to the power receiver clients 102a-102n. For example, in some embodiments, coherent signals can be determined by computing the complex conjugate of a received beacon (or calibration) signal at each antenna of the array such that the coherent signal is phased for delivering power to the particular power receiver client that transmitted the beacon (or calibration) signal.

Although not illustrated, each component of the environment, e.g., wireless device, wireless power transmission system, etc., can include control and synchronization mechanisms, e.g., a data communication synchronization module. The wireless power transmission systems 101a-101n can be connected to a power source such as, for example, a power outlet or source connecting the wireless power transmission systems to a standard or primary alternating current (AC) power supply in a building. Alternatively, or additionally, one or more of the wireless power transmission systems 101a-101n can be powered by a battery or via other mechanisms, e.g., solar cells, etc.

The power receiver clients 102a-102n and/or the wireless power transmission systems 101a-101n are configured to operate in a multipath wireless power delivery environment. That is, the power receiver clients 102a-102n and the wireless power transmission systems 101a-101n are configured to utilize reflective objects 106 such as, for example, walls or other RF reflective obstructions within range to transmit beacon (or calibration) signals and/or receive wireless power and/or data within the wireless power delivery environment. The reflective objects 106 can be utilized for multi-directional signal communication regardless of whether a blocking object is in the line of sight between the wireless power transmission system and the power receiver client.

As described herein, each wireless device 102a-102n can be any system and/or device, and/or any combination of devices/systems that can establish a connection with another device, a server and/or other systems within the example environment 100. In some embodiments, the wireless devices 102a-102n include displays or other output functionalities to present data to a user and/or input functionalities to receive data from the user. By way of example, a wireless device 102 can be, but is not limited to, a video game controller, a server desktop, a desktop computer, a computer cluster, a mobile computing device such as a notebook, a laptop computer, a handheld computer, a mobile phone, a smart phone, a PDA, a Blackberry device, a Treo, and/or an iPhone, etc. By way of example and not limitation, the wireless device 102 can also be any wearable device such as watches, necklaces, rings or even devices embedded on or within the customer. Other examples of a wireless device 102 include, but are not limited to, safety sensors (e.g., fire or carbon monoxide), electric toothbrushes, electronic door lock/handles, electric light switch controller, electric shavers, etc.

Although not illustrated in the example of FIG. 1, the wireless power transmission system 101 and the power receiver clients 103a-103n can each include a data communication module for communication via a data channel. Alternatively, or additionally, the power receiver clients 103a-103n can direct the wireless devices 102.1-102.n to communicate with the wireless power transmission system via existing data communications modules. In some embodiments the beacon signal, which is primarily referred to herein as a continuous waveform, can alternatively or additionally take the form of a modulated signal.

Figure 2:
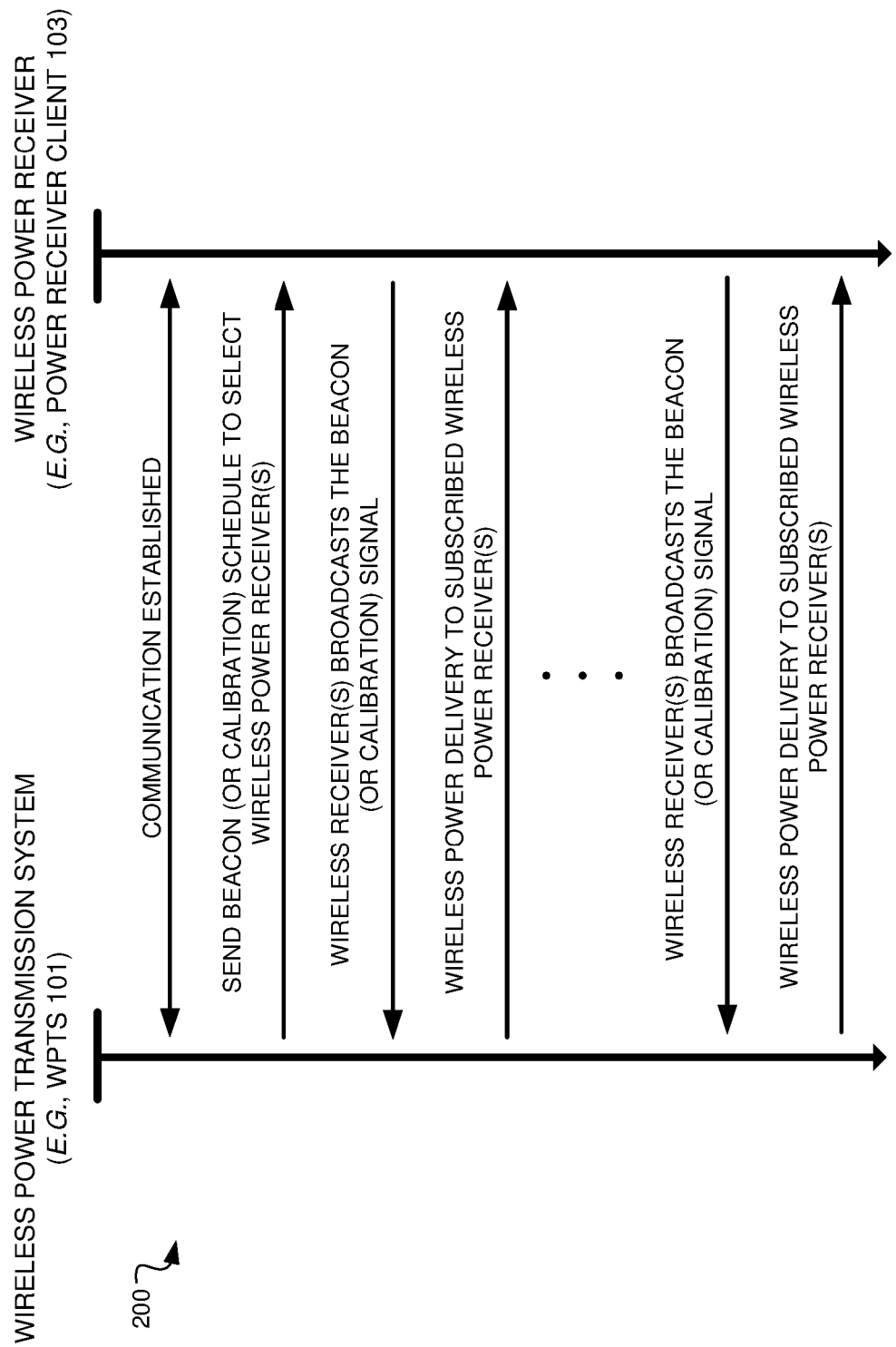
FIG. 2 depicts a sequence diagram illustrating example operations between a wireless power transmission system and a wireless receiver client for commencing wireless power delivery in accordance with some embodiments.

FIG. 2 is a sequence diagram 200 illustrating example operations between a wireless power delivery system (e.g., WPTS 101) and a wireless power receiver client (e.g., wireless power receiver client 103) for establishing wireless power delivery in a multipath wireless power delivery, according to an embodiment. Initially, communication is established between the wireless power transmission system 101 and the power receiver client 103. The initial communication can be, for example, a data communication link that is established via one or more antennas 104 of the wireless power transmission system 101. As discussed, in some embodiments, one or more of the antennas 104a-104n can be data antennas, wireless power transmission antennas, or dual-purpose data/power antennas. Various information can be exchanged between the wireless power transmission system 101 and the wireless power receiver client 103 over this data communication channel. For example, wireless power signaling can be time sliced among various clients in a wireless power delivery environment. In such cases, the wireless power transmission system 101 can send beacon schedule information, e.g., Beacon Beat Schedule (BBS) cycle, power cycle information, etc., so that the wireless power receiver client 103 knows when to transmit (broadcast) its beacon signals and when to listen for power, etc.

Continuing with the example of FIG. 2, the wireless power transmission system 101 selects one or more wireless power receiver clients for receiving power and sends the beacon schedule information to the select power receiver clients 103. The wireless power transmission system 101 can also send power transmission scheduling information so that the power receiver client 103 knows when to expect (e.g., a window of time) wireless power from the wireless power transmission system. The power receiver client 103 then generates a beacon (or calibration) signal and broadcasts the beacon during an assigned beacon transmission window (or time slice) indicated by the beacon schedule information, e.g., Beacon Beat Schedule (BBS) cycle. As discussed herein, the wireless power receiver client 103 include one or more antennas (or transceivers) which have a radiation and reception pattern in three-dimensional space proximate to the wireless device 102 in which the power receiver client 103 is embedded.

The wireless power transmission system 101 receives the beacon from the power receiver client 103 and detects and/or otherwise measures the phase (or direction) from which the beacon signal is received at multiple antennas. The wireless power transmission system 101 then delivers wireless power to the power receiver client 103 from the multiple antennas 103 based on the detected or measured phase (or direction) of the received beacon at each of the corresponding antennas. In some embodiments, the wireless power transmission system 101 determines the complex conjugate of the measured phase of the beacon and uses the complex conjugate to determine a transmit phase that configures the antennas for delivering and/or otherwise directing wireless power to the power receiver client 103 via the same path over which the beacon signal was received from the power receiver client 103.

In some embodiments, the wireless power transmission system 101 includes many antennas; one or more of which are used to deliver power to the power receiver client 103. The wireless power transmission system 101 can detect and/or otherwise determine or measure phases at which the beacon signals are received at each antenna. The large number of antennas may result in different phases of the beacon signal being received at each antenna of the wireless power transmission system 101. As discussed above, the wireless power transmission system 101 can determine the complex conjugate of the beacon signals received at each antenna. Using the complex conjugates, one or more antennas may emit a signal that takes into account the effects of the large number of antennas in the wireless power transmission system 101. In other words, the wireless power transmission system 101 can emit a wireless power transmission signal from the one or more antennas in such a way as to create an aggregate signal from the one or more of the antennas that approximately recreates the waveform of the beacon in the opposite direction. Said another way, the wireless power transmission system 101 can deliver wireless RF power to the client device via the same paths over which the beacon signal is received at the wireless power transmission system 101. These paths can utilize reflective objects 106 within the environment. Additionally, the wireless power transmission signals can be simultaneously transmitted from the wireless power transmission system 101 such that the wireless power transmission signals collectively match the antenna radiation and reception pattern of the client device in a three-dimensional (3D) space proximate to the client device.

As shown, the beacon (or calibration) signals can be periodically transmitted by power receiver clients 103 within the power delivery environment according to, for example, the BBS, so that the wireless power transmission system 101 can maintain knowledge and/or otherwise track the location of the power receiver clients 103 in the wireless power delivery environment. The process of receiving beacon signals from a wireless power receiver client at the wireless power transmission system and, in turn, responding with wireless power directed to that particular client is referred to herein as retrodirective wireless power delivery.

Furthermore, as discussed herein, wireless power can be delivered in power cycles defined by power schedule information. A more detailed example of the signaling required to commence wireless power delivery is described now with reference to FIG. 3.

Figure 3:
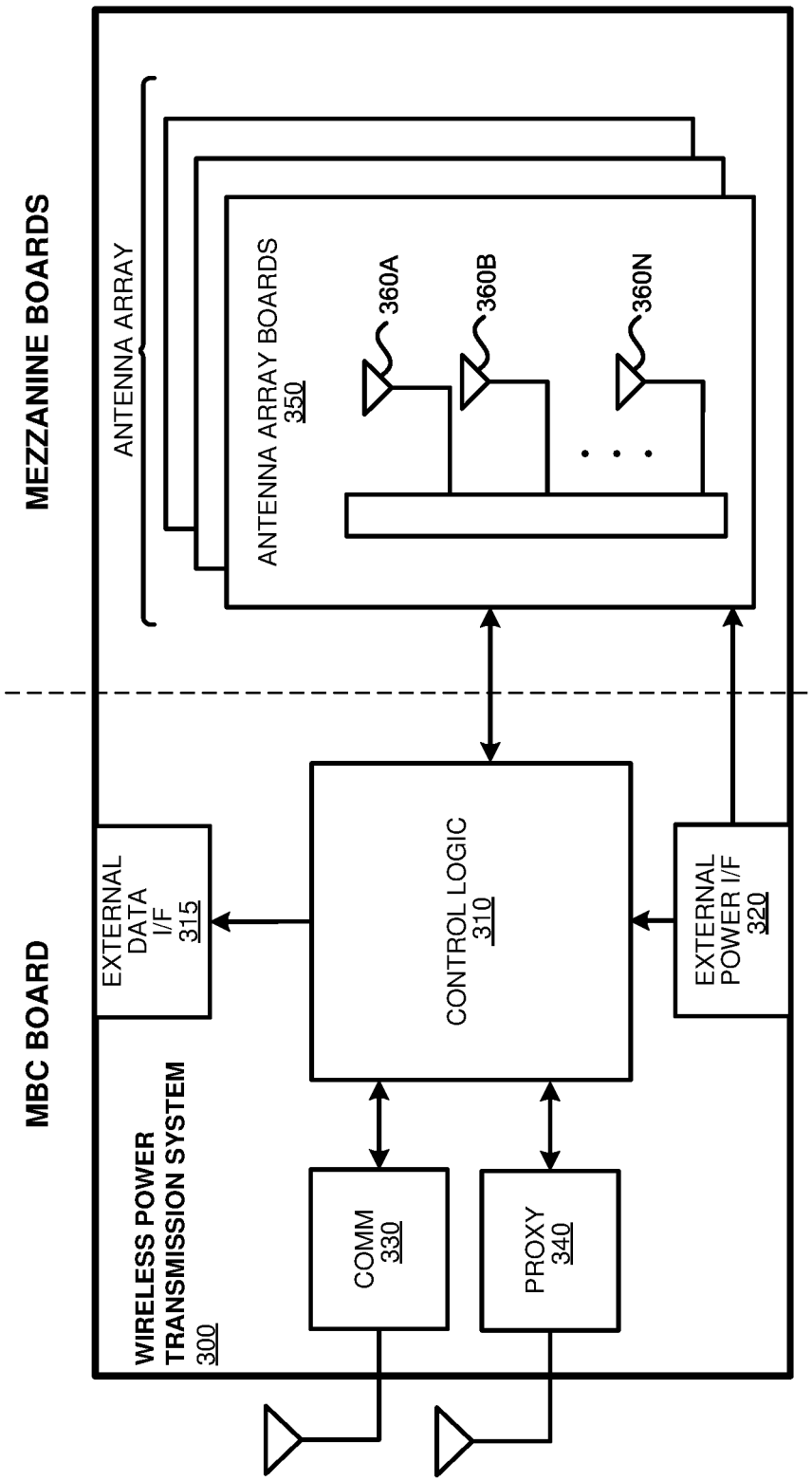
FIG. 3 depicts a block diagram illustrating example components of a wireless power transmission system in accordance with some embodiments.

FIG. 3 is a block diagram illustrating example components of a wireless power transmission system 300, in accordance with an embodiment. As illustrated in the example of FIG. 3, the wireless charger 300 includes a master bus controller (MBC) board and multiple mezzanine boards that collectively comprise the antenna array. The MBC includes control logic 310, an external data interface (I/F) 315, an external power interface (I/F) 320, a communication block 330 and proxy 340. The mezzanine (or antenna array boards 350) each include multiple antennas 360a-360n. Some or all of the components can be omitted in some embodiments. Additional components are also possible. For example, in some embodiments only one of communication block 330 or proxy 340 may be included.

The control logic 310 is configured to provide control and intelligence to the array components. The control logic 310 may comprise one or more processors, FPGAs, memory units, etc., and direct and control the various data and power communications. The communication block 330 can direct data communications on a data carrier frequency, such as the base signal clock for clock synchronization. The data communications can be Bluetooth™, Wi-Fi™, ZigBee™, etc., including combinations or variations thereof. Likewise, the proxy 340 can communicate with clients via data communications as discussed herein. The data communications can be, by way of example and not limitation, Bluetooth™, Wi-Fi™, ZigBee™, etc. Other communication protocols are possible.

In some embodiments, the control logic 310 can also facilitate and/or otherwise enable data aggregation for Internet of Things (IoT) devices. In some embodiments, wireless power receiver clients can access, track and/or otherwise obtain IoT information about the device in which the wireless power receiver client is embedded and provide that IoT information to the wireless power transmission system 300 over a data connection. This IoT information can be provided to via an external data interface 315 to a central or cloud-based system (not shown) where the data can be aggregated, processed, etc. For example, the central system can process the data to identify various trends across geographies, wireless power transmission systems, environments, devices, etc. In some embodiments, the aggregated data and or the trend data can be used to improve operation of the devices via remote updates, etc. Alternatively, or additionally, in some embodiments, the aggregated data can be provided to third party data consumers. In this manner, the wireless power transmission system acts as a Gateway or Enabler for the IoTs. By way of example and not limitation, the IoT information can include capabilities of the device in which the wireless power receiver client is embedded, usage information of the device, power levels of the device, information obtained by the device or the wireless power receiver client itself, e.g., via sensors, etc.

The external power interface 320 is configured to receive external power and provide the power to various components. In some embodiments, the external power interface 320 may be configured to receive a standard external 24 Volt power supply. In other embodiments, the external power interface 320 can be, for example, 120/240 Volt AC mains to an embedded DC power supply which sources the required 12/24/48 Volt DC to provide the power to various components. Alternatively, the external power interface could be a DC supply which sources the required 12/24/48 Volts DC. Alternative configurations are also possible.

In operation, the master bus controller (MBC), which controls the wireless power transmission system 300, receives power from a power source and is activated. The MBC then activates the proxy antenna elements on the wireless power transmission system and the proxy antenna elements enter a default "discovery" mode to identify available wireless receiver clients within range of the wireless power transmission system. When a client is found, the antenna elements on the wireless power transmission system power on, enumerate, and (optionally) calibrate.

The MBC then generates beacon transmission scheduling information and power transmission scheduling information during a scheduling process. The scheduling process includes selection of power receiver clients. For example, the MBC can select power receiver clients for power transmission and generate a Beacon Beat Schedule (BBS) cycle and a Power Schedule (PS) for the selected wireless power receiver clients. As discussed herein, the power receiver clients can be selected based on their corresponding properties and/or requirements.

In some embodiments, the MBC can also identify and/or otherwise select available clients that will have their status queried in the Client Query Table (CQT). Clients that are placed in the CQT are those on "standby", e.g., not receiving a charge. The BBS and PS are calculated based on vital information about the clients such as, for example, battery status, current activity/usage, how much longer the client has until it runs out of power, priority in terms of usage, etc.

The Proxy AE broadcasts the BBS to all clients. As discussed herein, the BBS indicates when each client should send a beacon. Likewise, the PS indicates when and to which clients the array should send power to and when clients should listen for wireless power. Each client starts broadcasting its beacon and receiving power from the array per the BBS and PS. The Proxy can concurrently query the Client Query Table to check the status of other available clients. In some embodiments, a client can only exist in the BBS or the CQT (e.g., waitlist), but not in both. The information collected in the previous step continuously and/or periodically updates the BBS cycle and/or the PS.

Figure 4:
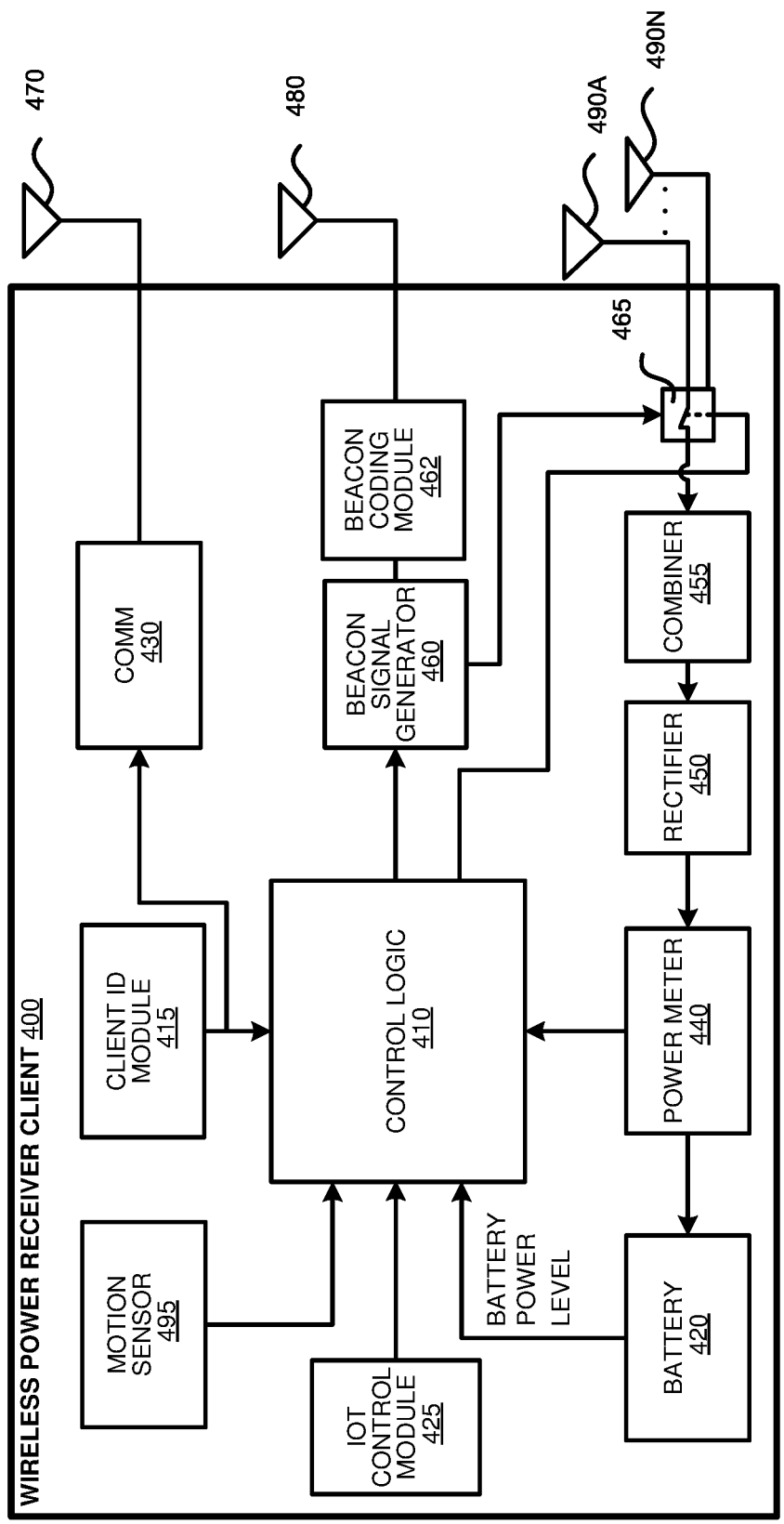
FIG. 4 depicts a block diagram illustrating example components of a wireless power receiver client in accordance with some embodiments.

FIG. 4 is a block diagram illustrating example components of a wireless power receiver client, in accordance with some embodiments. As illustrated in the example of FIG. 4, the receiver 400 includes control logic 410, battery 420, an IoT control module 425, communication block 430 and associated antenna 470, power meter 440, rectifier 450, a combiner 455, beacon signal generator 460, beacon coding unit 462 and an associated antenna 480, and switch 465 connecting the rectifier 450 or the beacon signal generator 460 to one or more associated antennas 490a-n. Some or all of the components can be omitted in some embodiments. For example, in some embodiments, the wireless power receiver client does not include its own antennas but instead utilizes and/or otherwise shares one or more antennas (e.g., Wi-Fi antenna) of the wireless device in which the wireless power receiver client is embedded. Moreover, in some embodiments, the wireless power receiver client may include a single antenna that provides data transmission functionality as well as power/data reception functionality. Additional components are also possible.

A combiner 455 receives and combines the received power transmission signals from the power transmitter in the event that the receiver 400 has more than one antenna. The combiner can be any combiner or divider circuit that is configured to achieve isolation between the output ports while maintaining a matched condition. For example, the combiner 455 can be a Wilkinson Power Divider circuit. The rectifier 450 receives the combined power transmission signal from the combiner 455, if present, which is fed through the power meter 440 to the battery 420 for charging. The power meter 440 can measure the received power signal strength and provides the control logic 410 with this measurement.

The control logic 410 can receive the battery power level from the battery 420 itself. The control logic 410 may also transmit/receive via the communication block 430 a data signal on a data carrier frequency, such as the base signal clock for clock synchronization. The beacon signal generator 460 generates the beacon signal, or calibration signal, transmits the beacon signal using either the antenna 480 or 490 after the beacon signal is encoded.

It may be noted that, although the battery 420 is shown as charged by, and providing power to, the receiver 400, the receiver may also receive its power directly from the rectifier 450. This may be in addition to the rectifier 450 providing charging current to the battery 420, or in lieu of providing charging. Also, it may be noted that the use of multiple antennas is one example of implementation and the structure may be reduced to one shared antenna.

In some embodiments, the control logic 410 and/or the IoT control module 425 can communicate with and/or otherwise derive IoT information from the device in which the wireless power receiver client 400 is embedded. Although not shown, in some embodiments, the wireless power receiver client 400 can have one or more data connections (wired or wireless) with the device in which the wireless power receiver client 400 is embedded over which IoT information can be obtained. Alternatively, or additionally, IoT information can be determined and/or inferred by the wireless power receiver client 400, e.g., via one or more sensors. As discussed above, the IoT information can include, but is not limited to, information about the capabilities of the device in which the wireless power receiver client is embedded, usage information of the device in which the wireless power receiver client is embedded, power levels of the battery or batteries of the device in which the wireless power receiver client is embedded, and/or information obtained or inferred by the device in which the wireless power receiver client is embedded or the wireless power receiver client itself, e.g., via sensors, etc.

In some embodiments, a client identifier (ID) module 415 stores a client ID that can uniquely identify the power receiver client in a wireless power delivery environment. For example, the ID can be transmitted to one or more wireless power transmission systems when communication is established. In some embodiments, power receiver clients may also be able to receive and identify other power receiver clients in a wireless power delivery environment based on the client ID.

An optional motion sensor 495 can detect motion and signal the control logic 410 to act accordingly. For example, a device receiving power may integrate motion detection mechanisms such as accelerometers or equivalent mechanisms to detect motion. Once the device detects that it is in motion, it may be assumed that it is being handled by a user, and would trigger a signal to the array to either to stop transmitting power, or to lower the power transmitted to the device. In some embodiments, when a device is used in a moving environment like a car, train or plane, the power might only be transmitted intermittently or at a reduced level unless the device is critically low on power.

Figure 5A:
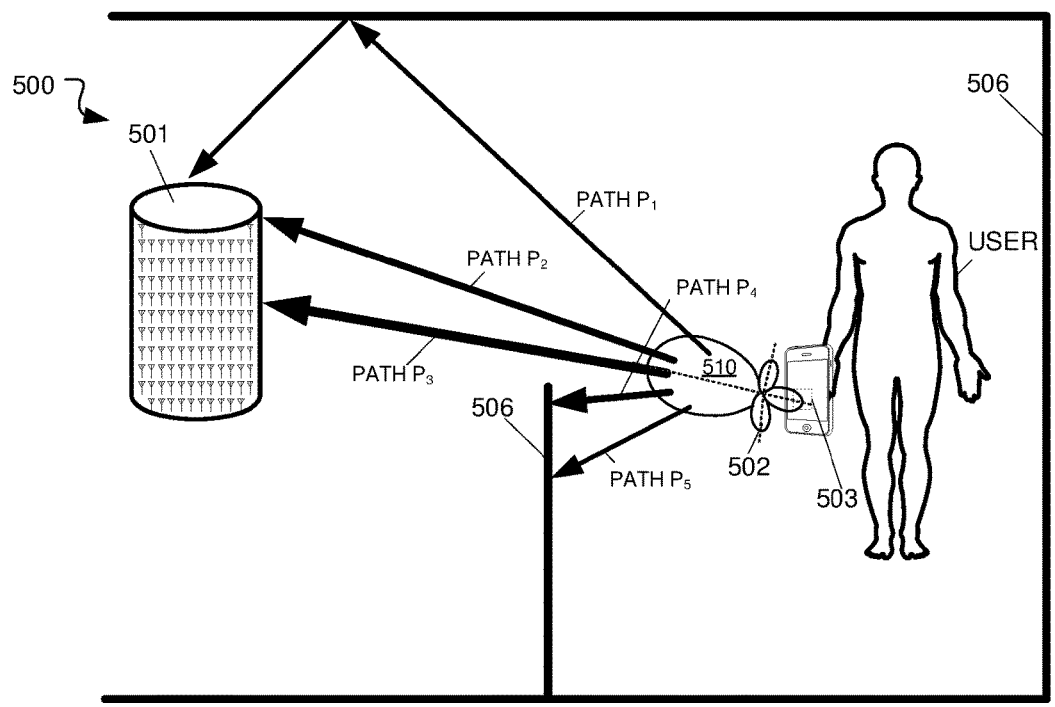
FIGS. 5A and 5B depict diagrams illustrating an example multipath wireless power delivery environment in accordance with some embodiments.
Figure 5B:
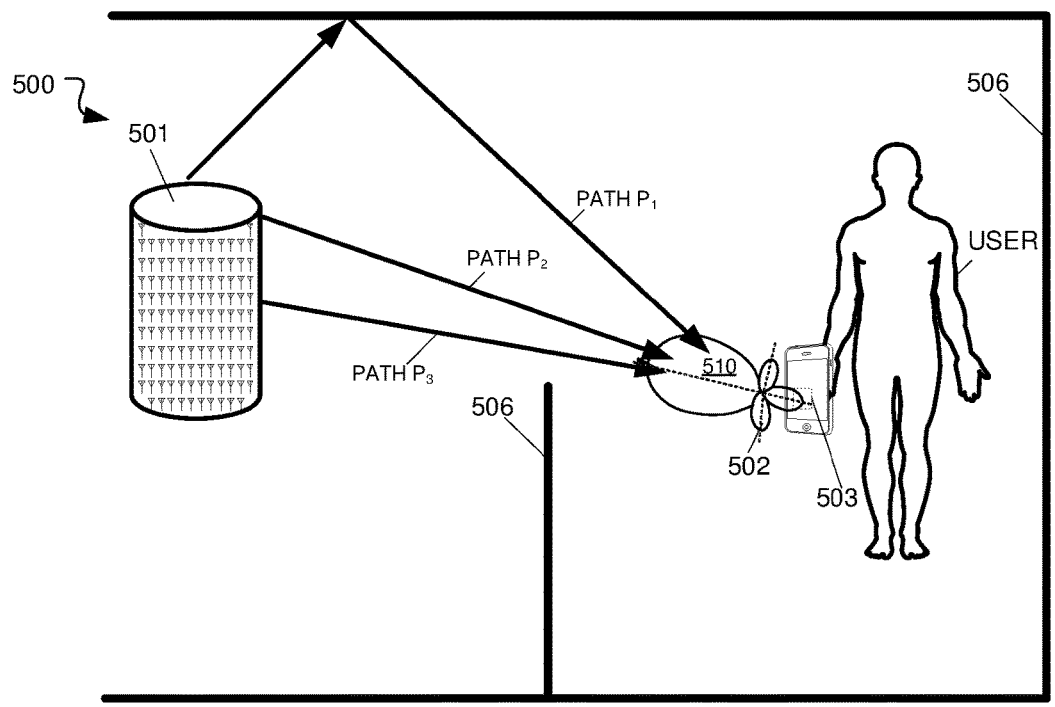

FIGS. 5A and 5B depict diagrams illustrating an example multipath wireless power delivery environment 500, according to some embodiments. The multipath wireless power delivery environment 500 includes a user operating a wireless device 502 including one or more wireless power receiver clients 503. The wireless device 502 and the one or more wireless power receiver clients 503 can be wireless device 102 of FIG. 1 and wireless power receiver client 103 of FIG. 1 or wireless power receiver client 400 of FIG. 4, respectively, although alternative configurations are possible. Likewise, wireless power transmission system 501 can be wireless power transmission system 101 FIG. 1 or wireless power transmission system 300 of FIG. 3, although alternative configurations are possible. The multipath wireless power delivery environment 500 includes reflective objects 506 and various absorptive objects, e.g., users, or humans, furniture, etc.

Wireless device 502 includes one or more antennas (or transceivers) that have a radiation and reception pattern 510 in three-dimensional space proximate to the wireless device 102. The one or more antennas (or transceivers) can be wholly or partially included as part of the wireless device 102 and/or the wireless power receiver client (not shown). For example, in some embodiments one or more antennas, e.g., Wi-Fi, Bluetooth, etc. of the wireless device 502 can be utilized and/or otherwise shared for wireless power reception. As shown in the example of FIGS. 5A and 5B, the radiation and reception pattern 510 comprises a lobe pattern with a primary lobe and multiple side lobes. Other patterns are also possible.

The wireless device 502 transmits a beacon (or calibration) signal over multiple paths to the wireless power transmission system 501. As discussed herein, the wireless device 502 transmits the beacon in the direction of the radiation and reception pattern 510 such that the strength of the received beacon signal by the wireless power transmission system, e.g., RSSI, depends on the radiation and reception pattern 510. For example, beacon signals are not transmitted where there are nulls in the radiation and reception pattern 510 and beacon signals are the strongest at the peaks in the radiation and reception pattern 510, e.g., peak of the primary lobe. As shown in the example of FIG. 5A, the wireless device 502 transmits beacon signals over five paths P1-P5. Paths P4 and P5 are blocked by reflective and/or absorptive object 506. The wireless power transmission system 501 receives beacon signals of increasing strengths via paths P1-P3. The bolder lines indicate stronger signals. In some embodiments the beacon signals are directionally transmitted in this manner to, for example, avoid unnecessary RF energy exposure to the user.

A fundamental property of antennas is that the receiving pattern (sensitivity as a function of direction) of an antenna when used for receiving is identical to the far-field radiation pattern of the antenna when used for transmitting. This is a consequence of the reciprocity theorem in electromagnetics. As shown in the example of FIGS. 5A and 5B, the radiation and reception pattern 510 is a three-dimensional lobe shape. However, the radiation and reception pattern 510 can be any number of shapes depending on the type or types, e.g., horn antennas, simple vertical antenna, etc. used in the antenna design. For example, the radiation and reception pattern 510 can comprise various directive patterns. Any number of different antenna radiation and reception patterns are possible for each of multiple client devices in a wireless power delivery environment.

Referring again to FIG. 5A, the wireless power transmission system 501 receives the beacon (or calibration) signal via multiple paths P1-P3 at multiple antennas or transceivers. As shown, paths P2 and P3 are direct line of sight paths while path P1 is a non-line of sight path. Once the beacon (or calibration) signal is received by the wireless power transmission system 501, the power transmission system 501 processes the beacon (or calibration) signal to determine one or more receive characteristics of the beacon signal at each of the multiple antennas. For example, among other operations, the wireless power transmission system 501 can measure the phases at which the beacon signal is received at each of the multiple antennas or transceivers.

The wireless power transmission system 501 processes the one or more receive characteristics of the beacon signal at each of the multiple antennas to determine or measure one or more wireless power transmit characteristics for each of the multiple RF transceivers based on the one or more receive characteristics of the beacon (or calibration) signal as measured at the corresponding antenna or transceiver. By way of example and not limitation, the wireless power transmit characteristics can include phase settings for each antenna or transceiver, transmission power settings, etc.

As discussed herein, the wireless power transmission system 501 determines the wireless power transmit characteristics such that, once the antennas or transceivers are configured, the multiple antennas or transceivers are operable to transit a wireless power signal that matches the client radiation and reception pattern in the three-dimensional space proximate to the client device. FIG. 5B illustrates the wireless power transmission system 501 transmitting wireless power via paths P1-P3 to the wireless device 502. Advantageously, as discussed herein, the wireless power signal matches the client radiation and reception pattern 510 in the three-dimensional space proximate to the client device. Said another way, the wireless power transmission system will transmit the wireless power signals in the direction in which the wireless power receiver has maximum gain, e.g., will receive the most wireless power. As a result, no signals are sent in directions in which the wireless power receiver cannot receiver, e.g., nulls and blockages. In some embodiments, the wireless power transmission system 501 measures the RSSI of the received beacon signal and if the beacon is less than a threshold value, the wireless power transmission system will not send wireless power over that path.

The three paths shown in the example of FIGS. 5A and 5B are illustrated for simplicity, it is appreciated that any number of paths can be utilized for transmitting power to the wireless device 502 depending on, among other factors, reflective and absorptive objects in the wireless power delivery environment.

II. Leveraging Device Components for Wireless Power Transfer

Example wireless power receiver clients are discussed herein that differ from previously described receivers, wireless power receiver client 103 of FIG. 1 or wireless power receiver client 400 of FIG. 4, in that this receiver leverages existing components of an electronic device. For example, components of Bluetooth Low Energy™ (BLE) enabled electronic devices (now referred to as Bluetooth Smart™) can be leveraged for wireless power transfer. The current BLE enabled electronic devices have a radio frequency (RF) communications interface for enabling low energy Bluetooth functions. This interface may also be utilized for wireless power transfer, thereby reducing the need for extra radio frequency collection components. Among other components, communication interfaces can also be leveraged from electronic devices supporting any number of other communication protocols. By way of example and not limitation, the techniques discussed herein facilitate leveraging components from devices enabled with Bluetooth™, ZigBee™, IEEE 802.15.4, ANT™, among others, and equivalents, including combinations and variations thereof. Furthermore, although the following disclosure is primarily directed to leveraging an existing RF communications interface, it is appreciated that the techniques discussed herein also apply to other electronic device components.

The leveraged systems, methods and techniques discussed herein facilitate low cost means for integrating wireless charging functionality into an electronic device. A variety of devices can be wireless power-enabled throughout a home or business allowing the devices to connect to a network and receive power wirelessly. For example, devices throughout an environment, including door locks, window blinds, thermostats, digital picture frames, etc., can all be enabled with internet connectivity. In an example scenario, as a user takes a picture and uploads it to a shared cloud environment, say Facebook™, for example, the digital picture frame of the user can incorporate the image automatically into its library. Likewise, Global Positioning System (GPS) data for the user's phone may inform the thermostat that no one is home, and the thermostat may raise or lower temperatures to reduce power use. Likewise, smart switches in the home may turn off lights and smart blinds may automatically adjust based upon date, time of the day, and expected temperatures (as collected from the weather report for the locality). Many of these devices are enabled with wireless or internet connectivity which can be leveraged to include wireless power functionality.

Techniques are described herein for leveraging these existing components of electronic devices with wireless or internet connectivity to reduce cost, size and complexity of electronic devices while enabling wireless power transfer. The techniques described herein can also be utilized to new low cost dual-function devices that utilize one or more of the same components for both wireless connectively and wireless power transfer.

In an environment where so many devices are connected and capable of "smart" functionality, wireless power becomes necessary to avoid costly retrofits. For example, the above smart window blinds could easily be installed in existing windows; however, virtually no window frames are currently supplied with wiring for power. Consequently, in order to make 'the internet of things' a reality, it is virtually imperative to have wireless powering capability.

Figure 6:
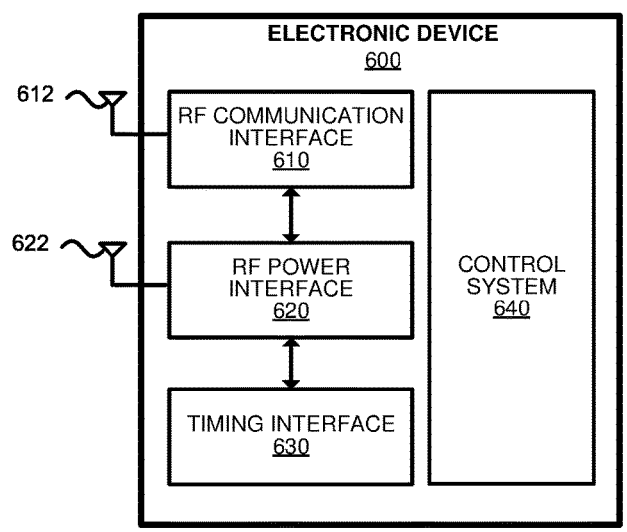
FIG. 6 is a block diagram illustrating example components of an electronic device that is configured to leverage one or more existing components for facilitating wireless power transfer in accordance with some embodiments.

FIG. 6 is a block diagram illustrating example components of an electronic device 600 that is configured to leverage one or more existing components for facilitating wireless power transfer, according to some embodiments. More specifically, as illustrated in the example of FIG. 6, the electronic device 600 includes an existing radio frequency (RF) communication interface 610 that is configured to transmit and receive communications over one or more antennas via a data communications protocol. The RF communication interface 610 is further leveraged to receive directed wireless power from a retrodirective wireless power transmission system. Electronic device 600 may be a wireless device 102 of FIG. 1, although alternative configurations are possible.

As shown in the example of FIG. 6, the electronic device includes the RF communications interface 610, a RF power interface 620, a timing interface 630, a control system 640, and antennas 612 and 622. Some or all of the components can be omitted in some embodiments. For example, in some embodiments, the control system 640 is not included. Moreover, in some embodiments a single antenna could be utilized in lieu of antennas 612 and 622 or one or more antennas of the electronic device can be shared (e.g., Wi-Fi/ Bluetooth antennas). Additional components are also possible.

The RF communication interface 610 is configured to transmit and receive communications over antenna 612 via one or more data communication protocols. As discussed herein, the RF communication interface 610 comprises an existing component of the electronic device 600 that is leveraged for wireless power transfer. As shown in the example of FIG. 6, the RF power interface 620 is coupled to the RF communication interface and configured to receive and process the wireless power delivery parameters, direct antenna 622 to transmit beacon signals to a wireless power transmission system responsive to beacon notifications from the timing interface and to process directed (or retrodirective) wireless power received or harvested by the leveraged RF communication interface 610.

The timing interface 630 is configured to generate and send the beacon notifications to the RF power interface component. Additionally, the timing interface 630 can also generate and send power reception notifications to the RF communication interface 610 in accordance with the power schedule information to notify the RF communication interface 610 about upcoming power reception cycles as determines by power schedule information. As shown in the example of FIG. 6, the control system 640 controls the primary functionality of the electronic device 600. For example, the control system 640 could be used to control a motor for "smart" blinds, the display of a "smart" thermostat, etc.

Figure 7:
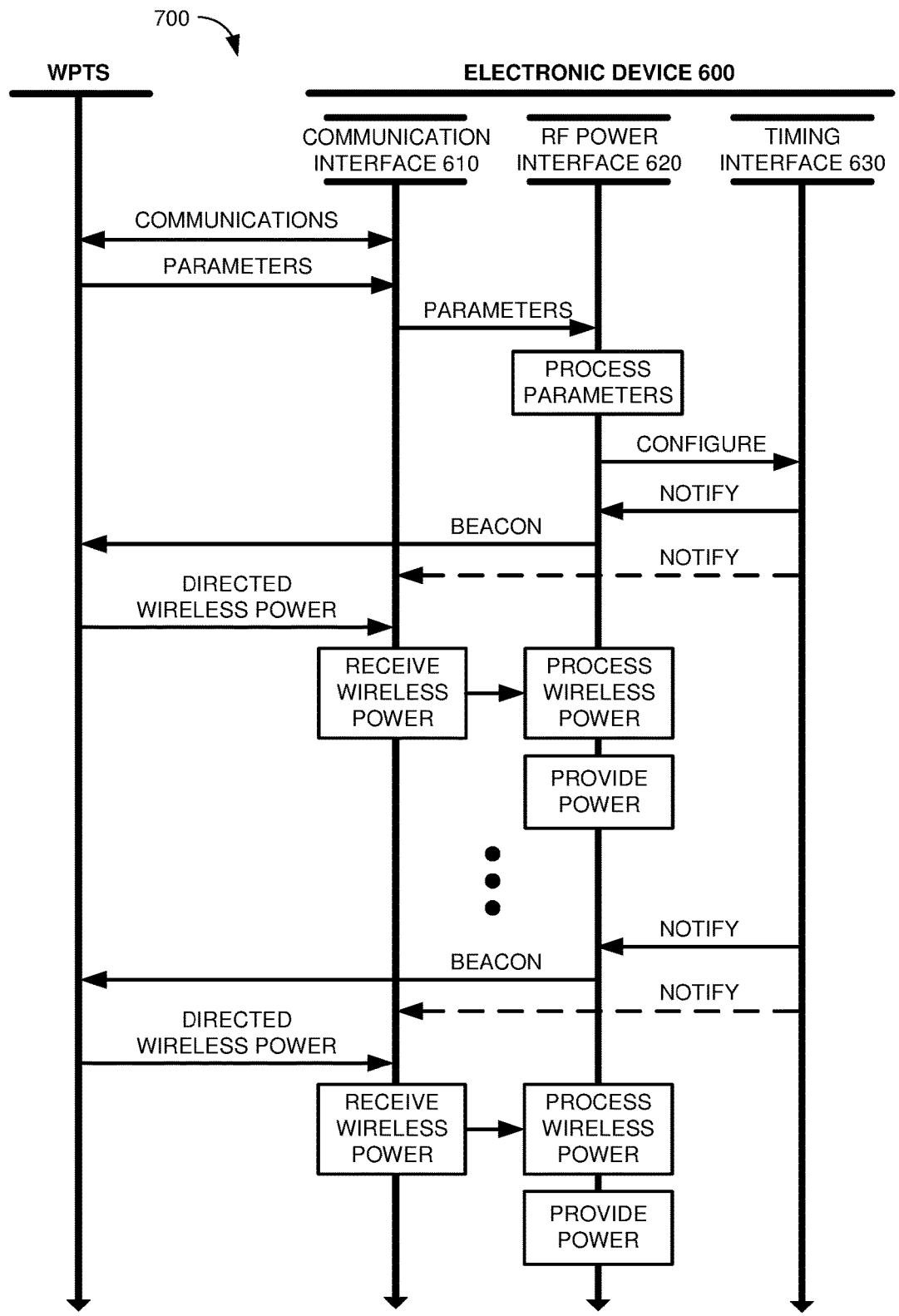
FIG. 7 depicts a sequence diagram illustrating example operations for operating an electronic device to leverage existing components for wireless power reception in a wireless power delivery environment in accordance with some embodiments.

To further illustrate the operation of the electronic device 600 and a wireless power transmission system, FIG. 7 is provided. FIG. 7 depicts a sequence diagram 700 illustrating example operations for operating an electronic device to leverage existing components for wireless power reception in a wireless power delivery environment, according to some embodiments.

Initially, communication is established between the wireless power transmission system and the existing RF communication interface 610. The initial communication can be, for example, communications established over a data communications link via a data communications protocol. In some embodiments, the data communications protocol is a low energy protocol such as, for example, a low energy Bluetooth protocol. In such instances, the RF communications interface 610 comprises a low energy Bluetooth interface.

Once communications are established, the wireless power transmission system provides wireless power delivery parameters to the existing RF communication interface 610 of electronic device 600. The existing RF communication interface 610 provides the wireless power delivery parameters to the RF power interface 620 of the electronic device which, in turn, processes the wireless power delivery parameters.

Responsive to receiving the wireless power delivery parameters, the RF power interface 620 configures the timing interface 630 according to at least one of the wireless power delivery parameters. The wireless power delivery parameters can include, among other information, receive power information, code information and beacon timing information. The beacon timing information can be determined from a beacon schedule information, e.g., Beacon Beat Schedule (BBS). Once configured, the timing interface 630 generates and sends the beacon notifications to the RF power interface 620 in accordance with the beacon timing information. Optionally, the timing interface 630 can also generate and send power reception notifications to the RF communication interface 610 in accordance with the power schedule information. The power reception notifications direct the RF communication interface 610 to anticipate reception of wireless power from the wireless power transmission system during an upcoming power cycle.

Responsive to a beacon notification, the RF power interface 620 directs one or more antennas to transmit a beacon signal to the wireless power transmission system. The wireless power transmission system then provides directed wireless power to the electronic device 600. The communication interface 610 receives the directed wireless power and the RF power interface 620 processes the power and provides the power for use by the electronic device 600. In some embodiments, the directed power is used to operate the electronic device or to charge a battery of the electronic device. The beacon process then continues as discussed herein so that wireless power can be the directed to the electronic device 600 as determined based on the beacon signals, i.e., retrodirective.

Figure 8:
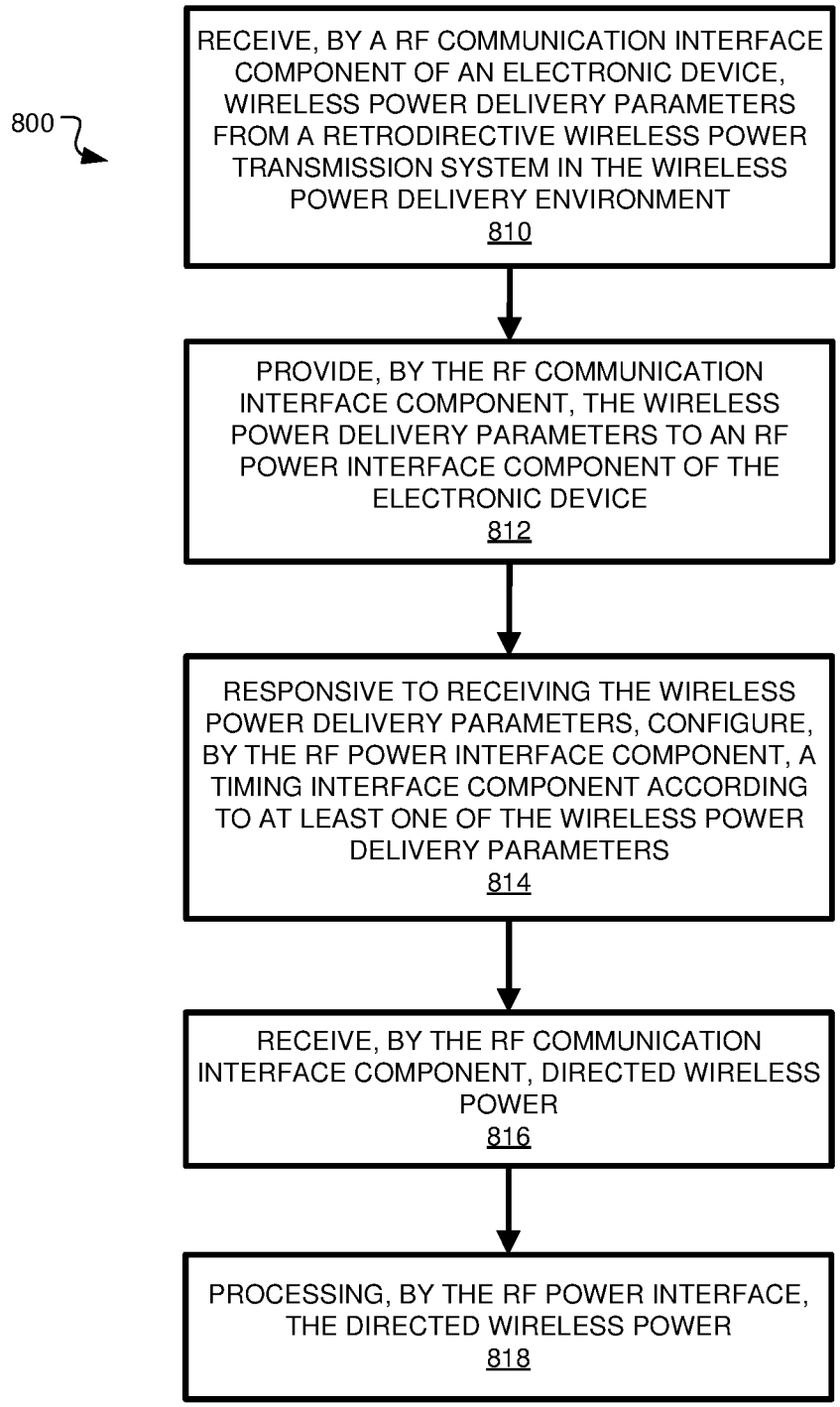
FIG. 8 depicts a flow diagram illustrating an example process for operating an electronic device to leverage existing components for wireless power reception in a wireless power delivery environment in accordance with some embodiments.

FIG. 8 depicts a flow diagram illustrating an example process 800 for operating an electronic device to leverage existing components for wireless power reception in a wireless power delivery environment according to some embodiments. An electronic device such as, for example, electronic device 600 of FIG. 6 can, among other functions, perform example process 600.

To begin, at 810, a radio frequency (RF) communication interface component of the electronic device receives wireless power delivery parameters from a retrodirective wireless power transmission system in the wireless power delivery environment. The RF communication interface is configured to communicate via a data communications protocol. At 812, the RF communication interface component of the electronic device provides the wireless power delivery parameters to an RF power interface component of the electronic device.

At 814, the RF power interface component of the electronic device, responsive to receiving the wireless power delivery parameters, configures a timing interface component according to at least one of the wireless power delivery parameters. More specifically, the timing interface component is configured to generate, among other notifications, beacon notifications. In some embodiments, the timing interface component generates the beacon notifications according to a beacon schedule. The wireless power delivery parameters include at least the beacon timing information for the electronic device. Responsive to a beacon notification, the RF power interface component directs one or more antennas of the electronic device to transmit a beacon signal to the retrodirective wireless power transmission system. At 816, the RF communication interface component of the electronic device, receives or collects directed wireless power from a wireless power transmission system. Lastly, at 818, the RF power interface of the electronic device processes the directed wireless power.

Figure 9:
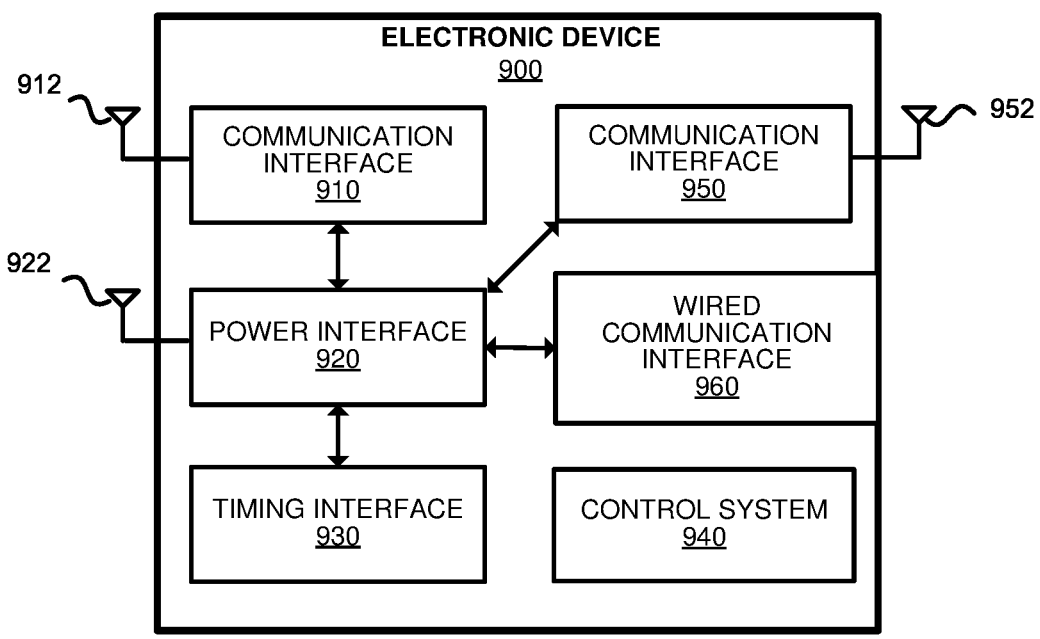
FIG. 9 is a block diagram illustrating example components of another electronic device that is configured to leverage one or more existing components for facilitating wireless power transfer in accordance with some embodiments.

FIG. 9 is a block diagram illustrating example components of another electronic device 900 that is configured to leverage one or more existing components for facilitating wireless power transfer, according to some embodiments. Example electronic device 900 is similar to electronic device 600 of FIG. 6 but example electronic device 900 includes multiple communication interfaces 910, 950 and 960. An electronic device can include any number of components or communication interfaces (either wired or wireless) which can be leveraged for receiving communications and/or wireless power from a wireless power transmission system.

As illustrated in the example of FIG. 9, the electronic device 900 includes existing wireless communication interfaces 910 and 950 that are configured to transmit and receive communications over one or more antennas (e.g., 912 and 952, respectively) via one or more data communications protocols. The electronic device 900 also includes a wired communication interface 960. In some embodiments, data communications between a wireless power transmission system and the electronic device 900 can be achieved by leveraging one or more of the communication interfaces 910, 950 and/or 960. For example, timing information can be communicated, by way of example and not limitation, via optical infrared (IR) communications, non-networked broadcast systems such as FM broadcast, fiber optics, CAN-BUS, power phase, RS-485, ModBus, etc.

Additionally, in some embodiments, different classes of data can each leverage a different component for communication. For example, the communications paths for each class of data, timing schedule, temporal go messages and client status messages, can each use different networks and/or different media. Moreover, it is appreciated that data communications can be sent reliably or unreliably as well as by broadcast or unicast.

Figure 10:
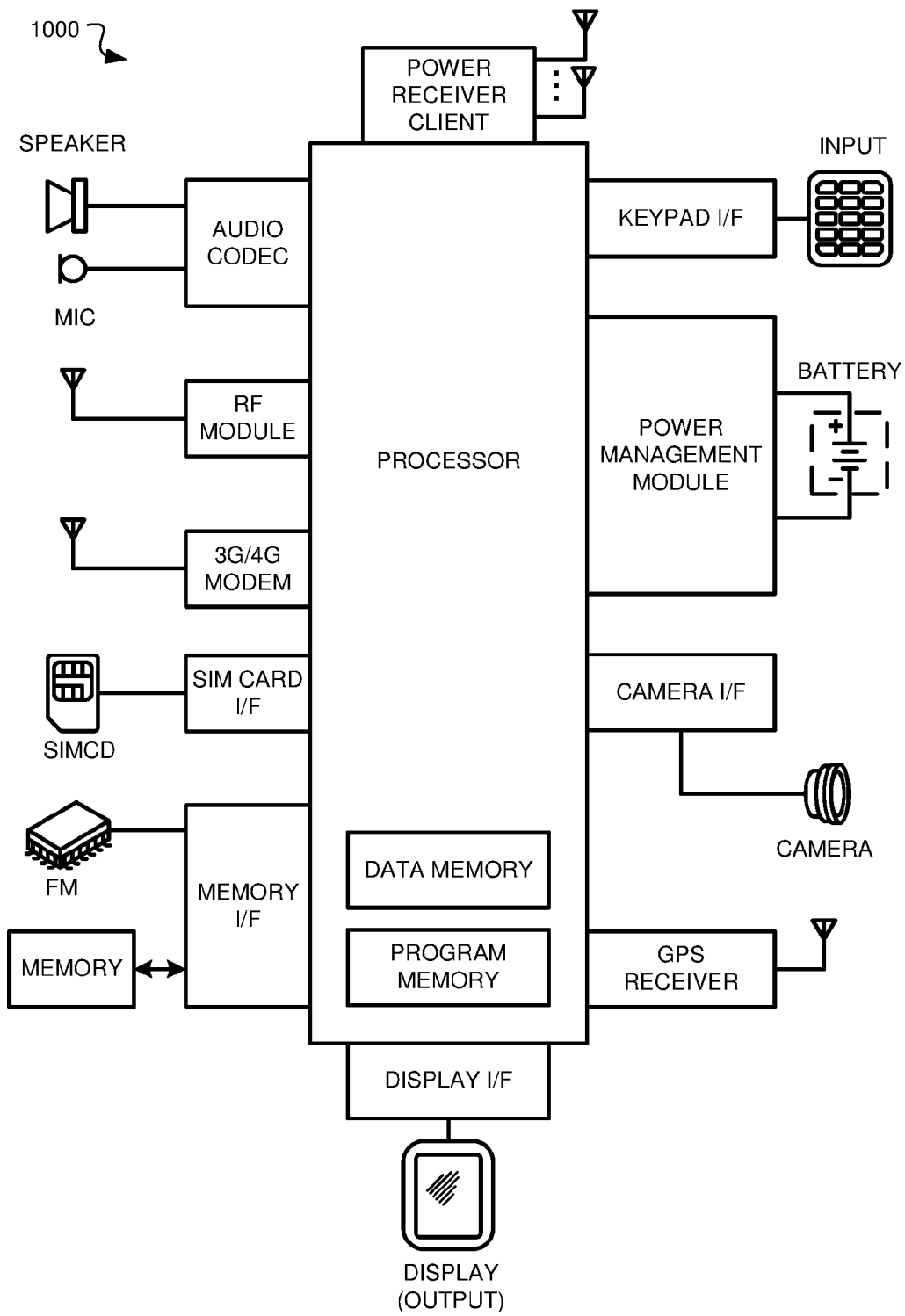
FIG. 10 depicts a block diagram illustrating example components of a representative mobile device or tablet computer with one or more wireless power receiver clients in the form of a mobile (or smart) phone or tablet computer device, according to some embodiments.

FIG. 10 depicts a block diagram illustrating example components of a representative mobile device or tablet computer 1000 with a wireless power receiver or client in the form of a mobile (or smart) phone or tablet computer device, according to an embodiment. Various interfaces and modules are shown with reference to FIG. 10, however, the mobile device or tablet computer does not require all of modules or functions for performing the functionality described herein. It is appreciated that, in many embodiments, various components are not included and/or necessary for operation of the category controller. For example, components such as GPS radios, cellular radios, and accelerometers may not be included in the controllers to reduce costs and/or complexity. Additionally, components such as ZigBee™ radios and RFID transceivers, along with antennas, can populate the Printed Circuit Board.

The wireless power receiver client can be a power receiver client 103 of FIG. 1, although alternative configurations are possible. Additionally, the wireless power receiver client can include one or more RF antennas for reception of power and/or data signals from a power transmission system, e.g., wireless power transmission system 101 of FIG. 1.

Figure 11:
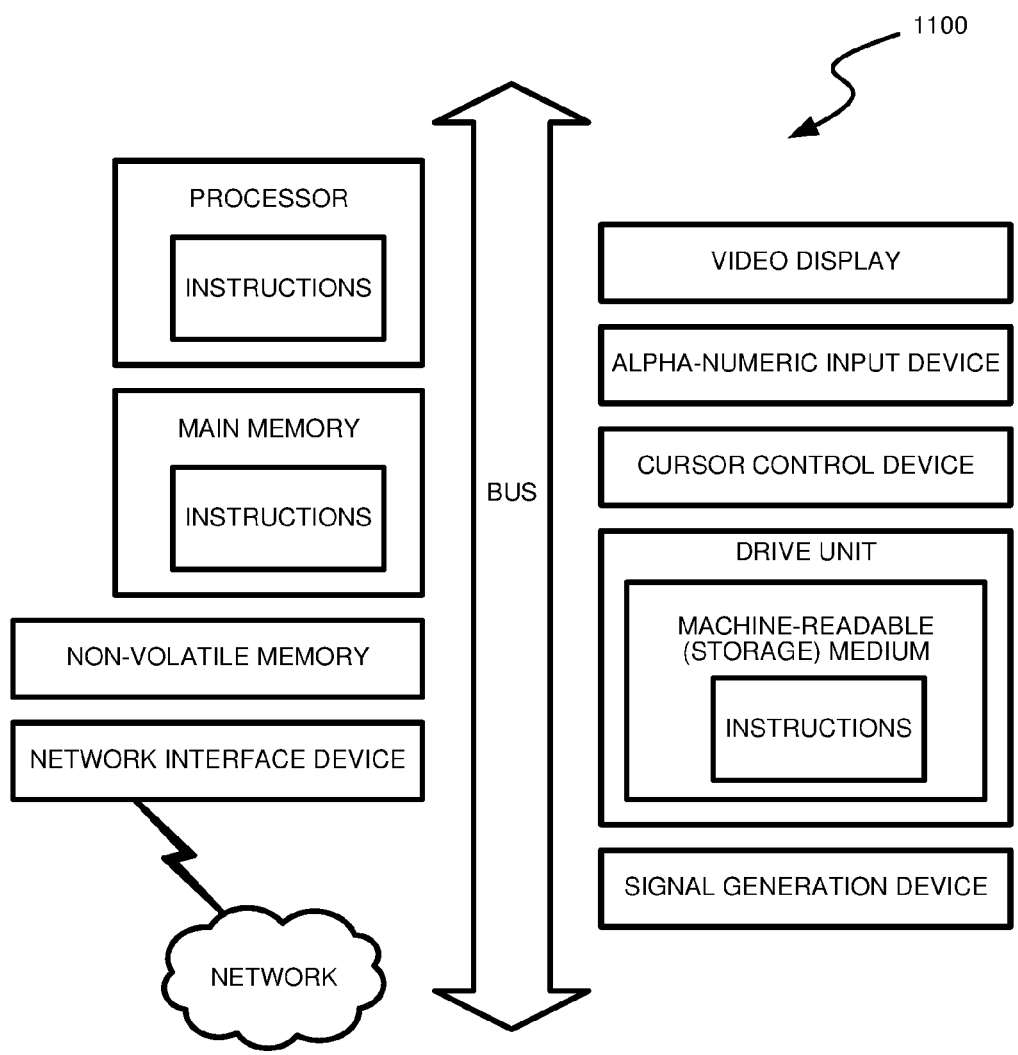
FIG. 11 depicts a diagrammatic representation of a machine, in the example form, of a computer system within which a set of instructions, for causing the machine to perform any one or more of the methodologies discussed herein, may be executed.

FIG. 11 depicts a diagrammatic representation of a machine, in the example form, of a computer system within which a set of instructions, for causing the machine to perform any one or more of the methodologies discussed herein, may be executed.

In the example of FIG. 11, the computer system includes a processor, memory, non-volatile memory, and an interface device. Various common components (e.g., cache memory) are omitted for illustrative simplicity. The computer system 1100 is intended to illustrate a hardware device on which any of the components depicted in the example of FIG. 1 (and any other components described in this specification) can be implemented. For example, the computer system can be any radiating object or antenna array system. The computer system can be of any applicable known or convenient type. The components of the computer system can be coupled together via a bus or through some other known or convenient device.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer 1100. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium". A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system. The interface can include an analog modem, isdn modem, cable modem, token ring interface, satellite transmission interface (e.g. "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 11 reside in the interface.

In operation, the computer system 1100 can be controlled by operating system software that includes a file management system, such as a disk operating system. One example of operating system software with associated file management system software is the family of operating systems known as Windows® from Microsoft Corporation of Redmond, Wash., and their associated file management systems.

Another example of operating system software with its associated file management system software is the Linux operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may thus be implemented using a variety of programming languages.

In alternative embodiments, the machine operates as a standalone device or may be connected (e.g., networked) to other machines. In a networked deployment, the machine may operate in the capacity of a server or a client machine in a client-server network environment or as a peer machine in a peer-to-peer (or distributed) network environment.

The machine may be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation.

In general, the routines executed to implement the embodiments of the disclosure, may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are, at times, shown as being performed in a series, these processes or blocks may instead be performed in parallel, or may be performed at different times. Further, any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. § 112, ¶6, other aspects may likewise be embodied as a means-plus-function claim, or in other forms, such as being embodied in a computer-readable medium. (Any claims intended to be treated under 35 U.S.C. § 112, ¶6 will begin with the words "means for".) Accordingly, the applicant reserves the right to add additional claims after filing the application to pursue such additional claim forms for other aspects of the disclosure.

The detailed description provided herein may be applied to other systems, not necessarily only the system described above. The elements and acts of the various examples described above can be combined to provide further implementations of the invention. Some alternative implementations of the invention may include not only additional elements to those implementations noted above, but also may include fewer elements. These and other changes can be made to the invention in light of the above Detailed Description. While the above description defines certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention.

What is claimed is:

1. A method of leveraging existing components of an electronic device for wireless power reception in a wireless power delivery environment, the method comprising:
   receiving, by a radio frequency (RF) communication interface component of the electronic device, wireless power delivery parameters from a retrodirective wireless power transmission system in the wireless power delivery environment,
      wherein the RF communication interface is configured to communicate via a data communications protocol;
   providing, by the RF communication interface component, the wireless power delivery parameters to an RF power interface component of the electronic device,
      wherein the wireless power delivery parameters include beacon timing information;
   responsive to receiving the wireless power delivery parameters, configuring, by the RF power interface component, a timing interface component according to at least the beacon timing information;
   directing, by the RF power interface component, one or more antennas of the electronic device to transmit a beacon signal to the retrodirective wireless power transmission system responsive to a beacon notification generated by the timing interface component;
   receiving, by the RF communication interface component, directed wireless power from the wireless power transmission system responsive to transmitting the beacon signal; and
   processing, by the RF power interface, the directed wireless power.

2. The method of claim 1, wherein the beacon notification is generated by the timing interface component.

3. The method of claim 1, further comprising:
   responsive to a power reception notification, directing, by the RF communication interface component, one or more antennas of the electronic device to anticipate reception of wireless power from the retrodirective wireless power transmission system during an upcoming time cycle.

4. The method of claim 3, wherein the power reception notification is generated by the timing interface component.

5. The method of claim 1, wherein the wireless power delivery parameters further include receiving power information or code information.

6. The method of claim 1, wherein the data communications protocol is a low power communications protocol.

7. The method of claim 1, wherein the directed power is used to operate the electronic device.

8. The method of claim 1, wherein the directed power is used to charge a battery of the electronic device.

9. An electronic device configured to leverage existing components for wireless power reception in a wireless power delivery environment, the electronic device comprising:
one or more antennas;
a radio frequency (RF) communication interface component configured to transmit and receive communications over the one or more antennas via a data communications protocol,
wherein the communications include wireless power delivery parameters received from a retrodirective wireless power transmission system in the wireless power delivery environment, and
wherein the wireless power delivery parameters include beacon timing information;
a RF power interface component coupled to the RF communication interface, the RF power interface configured to receive and process the wireless power delivery parameters;
a timing interface component coupled to the RF power interface, the timing interface configured to use the beacon timing information to generate and send a beacon notification to the RF power interface component,
wherein the RF communication interface component is further configured to:
direct the one or more antennas to transmit the beacon signal to the retrodirective wireless power transmission system responsive to the beacon notification,
receive directed wireless power from the retrodirective wireless power transmission system responsive to transmitting the beacon signal, and
provide the received power to the RF power interface component.

10. The electronic device of claim 9, wherein the RF communication interface component is further configured to provide the wireless power delivery parameters to the RF power interface component.

11. The electronic device of claim 9, wherein the RF power interface component is configured to, responsive to receiving the wireless power delivery parameters, configure the timing interface component according to at least one of the wireless power delivery parameters.

12. The electronic device of claim 9, wherein the wireless power delivery parameters include receiving power information and code information.

13. The electronic device of claim 9, wherein the data communications protocol is a low power communications protocol.

14. The electronic device of claim 9, further comprising a battery, wherein the RF power interface component is configured to charge the battery with the directed power.

15. The electronic device of claim 9, wherein the RF power interface component is configured to process the directed power and provide the power to operate the electronic device.

16. A wireless receiver component for an electronic device, the receiver component comprising:
a power interface component, the power interface component configured to receive and process wireless power delivery parameters and direct one or more antennas to transmit beacons responsive to beacon notifications,
wherein the wireless power delivery parameters include beacon timing information;
a timing interface component coupled to the power interface, the timing interface configured to use the beacon timing information to generate and send the beacon notifications to the power interface component,
wherein the power interface component is further configured to process directed wireless power received by a leveraged communication interface component of the electronic device responsive to transmitting the beacon signals.

17. The wireless receiver component of claim 16, wherein responsive to a beacon notification, the power interface component is configured to direct one or more antennas of the electronic device to transmit a beacon signal to the retrodirective wireless power transmission system.

18. The wireless receiver component of claim 16, wherein the directed power is used to operate the electronic device or to charge a battery of the electronic device.

19. The wireless receiver component of claim 16, wherein the power interface component is further configured to, responsive to receiving the wireless power delivery parameters, configure the timing interface component according to at least one of the wireless power delivery parameters.

* * * * *